US010896879B2

(12) United States Patent
Lee et al.

(10) Patent No.: US 10,896,879 B2
(45) Date of Patent: Jan. 19, 2021

(54) SEMICONDUCTOR PACKAGE HAVING REFLECTIVE LAYER WITH SELECTIVE TRANSMITTANCE

(71) Applicant: SAMSUNG ELECTRONICS CO., LTD., Suwon-si (KR)

(72) Inventors: Kun Sil Lee, Hwaseong-si (KR); Dong Kwan Kim, Hwaseong-si (KR); Bo Ram Kang, Yongin-si (KR); Ho Geon Song, Suwon-si (KR); Won Keun Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/201,708

(22) Filed: Nov. 27, 2018

(65) Prior Publication Data

US 2019/0287920 A1 Sep. 19, 2019

(30) Foreign Application Priority Data

Mar. 14, 2018 (KR) .................. 10-2018-0029714

(51) Int. Cl.
*H01L 23/552* (2006.01)
*G01N 23/18* (2018.01)

(52) U.S. Cl.
CPC .......... *H01L 23/552* (2013.01); *G01N 23/18* (2013.01)

(58) Field of Classification Search
CPC .............................. H01L 23/552; G01N 23/18
USPC ....................................................... 257/660
See application file for complete search history.

(56) References Cited

U.S. PATENT DOCUMENTS

| 6,310,120 B1 | 10/2001 | Shiobara et al. |
| 9,418,943 B2 | 8/2016 | Kim |
| 2008/0001241 A1 | 1/2008 | Tuckerman et al. |
| 2015/0103974 A1* | 4/2015 | Kim .................. H01L 25/0657 378/58 |
| 2015/0188011 A1* | 7/2015 | Kang .................. H01L 33/60 257/98 |
| 2016/0079178 A1* | 3/2016 | Kim .................. H01L 23/544 257/773 |
| 2016/0091615 A1* | 3/2016 | Peters .................. G01T 1/2002 250/336.1 |
| 2016/0206274 A1 | 7/2016 | Kang et al. |
| 2016/0268471 A1* | 9/2016 | Endo .................. H01L 33/46 |
| 2017/0301591 A1* | 10/2017 | Kim .................. H01L 22/12 |

FOREIGN PATENT DOCUMENTS

| JP | 06-268088 | 9/1994 |
| JP | 3426023 | 5/2003 |
| JP | 2006202791 | 8/2006 |
| KR | 10-0600169 | 7/2006 |
| KR | 101563910 | 10/2015 |

* cited by examiner

*Primary Examiner* — Igwe U Anya
(74) *Attorney, Agent, or Firm* — F. Chau & Associates, LLC

(57) ABSTRACT

A semiconductor package includes a semiconductor package substrate. An insulating layer is disposed on the semiconductor package substrate. A semiconductor chip is disposed on the semiconductor package substrate and is covered by the insulating layer. A reflective layer is disposed on the insulating layer and is spaced apart from the semiconductor chip. The reflective layer is configured to selectively transmit radiation through to the insulating layer. A protective layer is disposed on the reflective layer.

16 Claims, 29 Drawing Sheets

SEMICONDUCTOR PACKAGE HAVING REFLECTIVE LAYER WITH SELECTIVE TRANSMITTANCE

This application claims the benefit of Korean Patent Application No. 10-2018-0029714, filed on Mar. 14, 2018 in the Korean Intellectual Property Office, the disclosure of which is herein incorporated by reference in its entirety.

TECHNICAL FIELD

The present disclosure relates to a semiconductor package, and more specifically, to a semiconductor package having a reflective layer with selective transmittance.

DISCUSSION OF THE RELATED ART

During the manufacturing process, semiconductor devices may undergo a defect inspection procedure to detect any potential defects in the device. X-rays are generally used during defect inspection. However, the X-ray exposure may itself degrade the characteristics of the semiconductor device due to leakage of electric charge.

The X-rays used for defect inspection may include both hard X-rays, which have a shorter wavelength and an energy greater than 10 keV, and soft X-rays, which have a longer wavelength and an energy generally within the range of between 100 eV and 10 keV.

SUMMARY

A semiconductor package includes a semiconductor package substrate. An insulating layer is disposed on the semiconductor package substrate. A semiconductor chip is disposed on the semiconductor package substrate and is covered by the insulating layer. A reflective layer is disposed on the insulating layer and is spaced apart from the semiconductor chip. The reflective layer is configured to selectively transmit radiation through to the insulating layer. A protective layer is disposed on the reflective layer.

A semiconductor package includes a semiconductor package substrate. A molding layer is disposed on the semiconductor package substrate. A semiconductor chip is disposed on the semiconductor package substrate and is covered by the insulating layer. The semiconductor package is configured to be more transmissive of hard X-rays than soft X-rays.

A semiconductor package includes a semiconductor package substrate. An insulating layer is disposed on the semiconductor package substrate. A semiconductor chip is disposed on the semiconductor package substrate and is covered by the insulating layer. A reflective layer is disposed on the insulating layer and is spaced apart from the semiconductor chip and includes a metal material having an atomic number greater than 12. A protective layer is disposed on the reflective layer.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

A semiconductor package according to some exemplary embodiments of the present inventive concept will be described below with reference to FIGS. 1 to 5.

Figure 1:
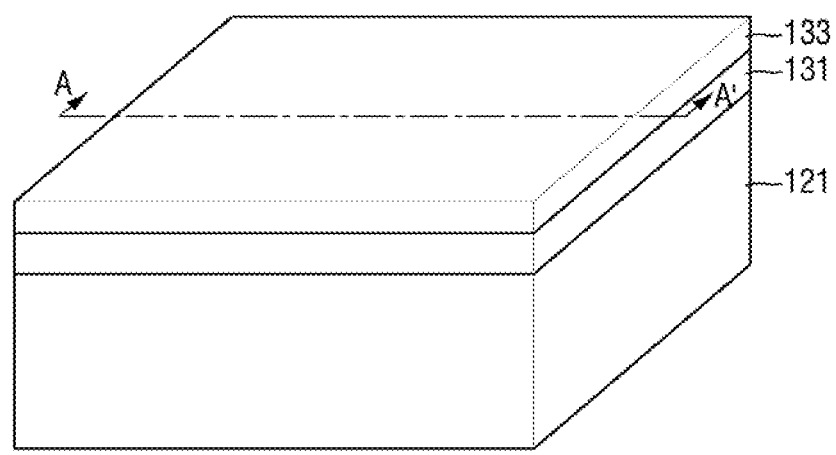
FIG. 1 is a perspective view illustrating a semiconductor package according to some exemplary embodiments of the present inventive concept.
Figure 2:
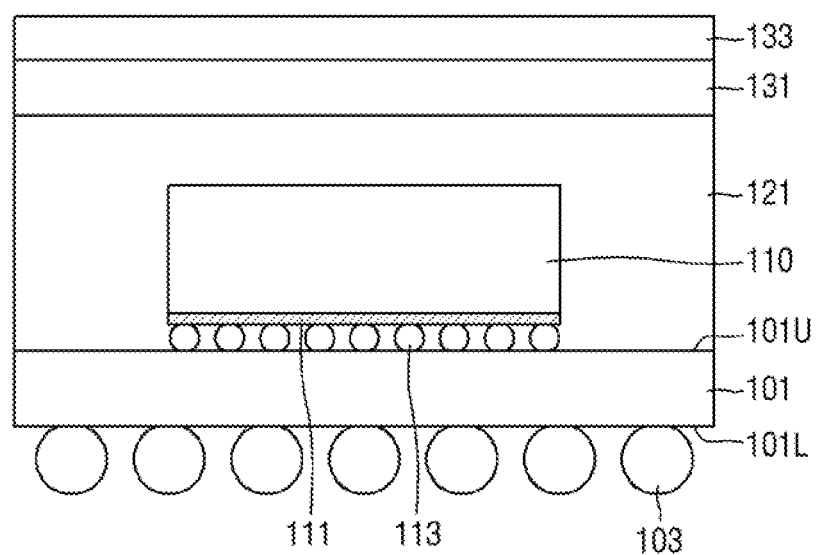
FIG. 2 is a cross-sectional view taken along line A-A' of FIG. 1.

FIG. 1 is a perspective view illustrating the semiconductor package according to some exemplary embodiments of the present inventive concept. FIG. 2 is a cross-sectional view taken along line A-A' of FIG. 1.

Referring to FIGS. 1 and 2, the semiconductor package according to some exemplary embodiments of the present inventive concept may include a semiconductor package substrate 101, an external connection terminal 103, a semiconductor chip 110, and a molding layer. The molding layer may include an insulating layer 121 and an auxiliary film. The auxiliary film may include a reflective layer 131 and a first protective layer 133.

The semiconductor package substrate 101 may be a package substrate, and may be, for example, a printed circuit board (PCB) or a ceramic substrate. In some exemplary embodiments of the present inventive concept, the semiconductor package substrate 101 may be a wafer, a bare silicon (Si) chip, or a silicon interposer.

The semiconductor package substrate 101 may include an upper surface 101U and a lower surface 101L facing each other. A semiconductor chip 110 may be mounted on the upper surface 101U of the semiconductor package substrate 101. For example, the external connection terminal 103 may be attached to the lower surface 101L of the semiconductor package substrate 101. In the drawings, the external connection terminal 103 is illustrated as having seven parts, but the technical idea of the present inventive concept is not limited thereto and this number of external connection terminals 103 is illustrated as a simple example of the contemplated structure. For example, there may be fewer than seven or more than seven external connection terminals 103 attached to the lower surface 101L of the semiconductor package substrates 101.

The external connection terminal 103 may be a conductive ball or a solder ball, but the technical idea of the present inventive concept is not limited thereto. The external connection terminal 103 may be, for example, a conductive bump, a conductive spacer, or a pin grid array (PGA). The semiconductor package may be, for example, electrically connected to an external device through the external connection terminal 103.

The semiconductor chip 110 may be mounted on the semiconductor package substrate 101. The lower surface of the semiconductor chip 110 may be a semiconductor element circuit region Ill. The semiconductor chip 110 may have, for example, the form of a flip chip. However, the technical idea of the present inventive concept is not limited thereto. For example, the semiconductor chip 110 may be mounted on the semiconductor package substrate 101 in various manners such as by wire bonding. This will be described later in detail with reference to FIG. 7.

The semiconductor chip 110 may be, for example, a memory chip, a logic chip, or the like. Although one semiconductor chip 110 is illustrated as being mounted on the semiconductor package substrate 101 in the drawing, the technical idea of the present inventive concept is not limited thereto. For example, a plurality of semiconductor chips may be mounted on the semiconductor package substrate 101, side-by-side and/or stacked.

The first connection element 113 may be disposed in the semiconductor element circuit region 111. The first connection element 113 may be, for example, a solder ball or a conductive bump.

The semiconductor chip 110 may be electrically connected to the semiconductor package substrate 101 through the first connection element 113. In the drawings, nine first connection elements 113 are illustrated, but the technical idea of the present inventive concept is not limited thereto. For example, the first connection element 113 may have fewer than nine or more than nine parts and this number of first connection elements 113 is illustrated as a simple example of the contemplated structure. The first connection element 113 may be connected to, for example, a silicon through electrode (TSV, through hole via) through hole via penetrating the semiconductor chip 110.

The insulating layer 121 may be disposed on the semiconductor package substrate 101. For example, the insulating layer 121 may be disposed on the upper surface 101U of the semiconductor package substrate 101 so as to entirely cover the upper surface 101U of the semiconductor package substrate 101. For example, the upper surface 101U of the semiconductor package substrate 101 might be covered by the insulating layer 121 so as not to be exposed.

For example, the insulating layer 121 may completely fill the space between the semiconductor chip 110 and the upper surface 101U of the semiconductor package substrate 101. The insulating layer 121 may completely surround the side surfaces of the semiconductor chip 110. The insulating layer 121 may completely cover the upper surface of the semiconductor chip 110. As a result, the semiconductor chip 110 may be buried inside the insulating layer 121.

The insulating layer 121 may have a certain height from the upper surface 101U of the semiconductor package substrate 101. For example, a part of the insulating layer 121 may be disposed on the semiconductor chip 110. For example, the height of the insulating layer 121 may be larger than the height of the upper surface of the semiconductor chip 110 on the basis of the upper surface 101U of the semiconductor package substrate 101. Here, the upper surface of the semiconductor chip 110 may be the opposite side surface of the semiconductor element circuit region 111, which faces the semiconductor element circuit region 111.

In some exemplary embodiments of the present inventive concept, the insulating layer 121 may include, for example, an insulating material that insulates the semiconductor chip 110 from other constituent elements. In some exemplary embodiments of the present inventive concept, the insulating layer 121 may be, for example, an epoxy molding compound (EMC).

The auxiliary films 131 and 133 may be disposed on the insulating layer 121. The auxiliary films 131 and 133 may be spaced apart from the semiconductor chip 110. In some exemplary embodiments of the present inventive concept, the auxiliary films 131 and 133 may selectively transmit radiation to the auxiliary films 131 and 133, and into the insulating layer 121.

The reflective layer 131 may be disposed on the insulating layer 121 and spaced apart from the semiconductor chip 110. On the basis of the upper surface 101U of the semiconductor package substrate 101, the lower surface of the reflective layer 131 may be higher than the upper surface of the semiconductor chip 110. The reflective layer 131 may entirely cover the upper surface of the insulating layer 121. Due to the reflective layer 131, the insulating layer 121 might not be exposed.

The reflective layer 131 may, for example, be in the form of a flat plate material or a thin foil. The reflective layer 131 may be, for example, a metal plate material or a metal foil.

The first protective layer 133 may be disposed on the reflective layer 131. The first protective layer 133 may entirely cover the upper surface of the reflective layer 131. Due to the first protective layer 133, the reflective layer 131 might not be exposed.

In some exemplary embodiments of the present inventive concept, the first protective layer 133 may include, for example, the same material as the material contained in the insulating layer 121. Alternatively, the first protective layer 133 may include, for example, a metal oxide.

The reflective layer 131 may selectively transmit radiation to the insulating layer 121. The first protective layer 133 may prevent corrosion of the reflective layer 131. In addition, the first protective layer 133 may protect the reflective layer 131 from exposure by the laser used to mark the semiconductor package. A detailed explanation of the optional transmission and the laser marking will be provided later.

Figure 3:
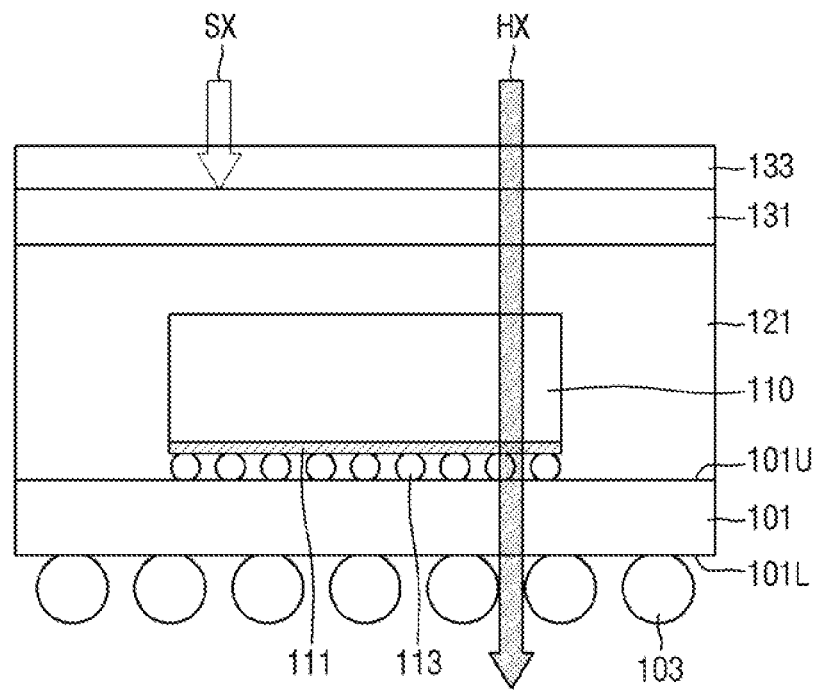
FIG. 3 is a diagram illustrating auxiliary films 131 and 133 included in the semiconductor package according to some exemplary embodiments of the present inventive concept.
Figure 4:
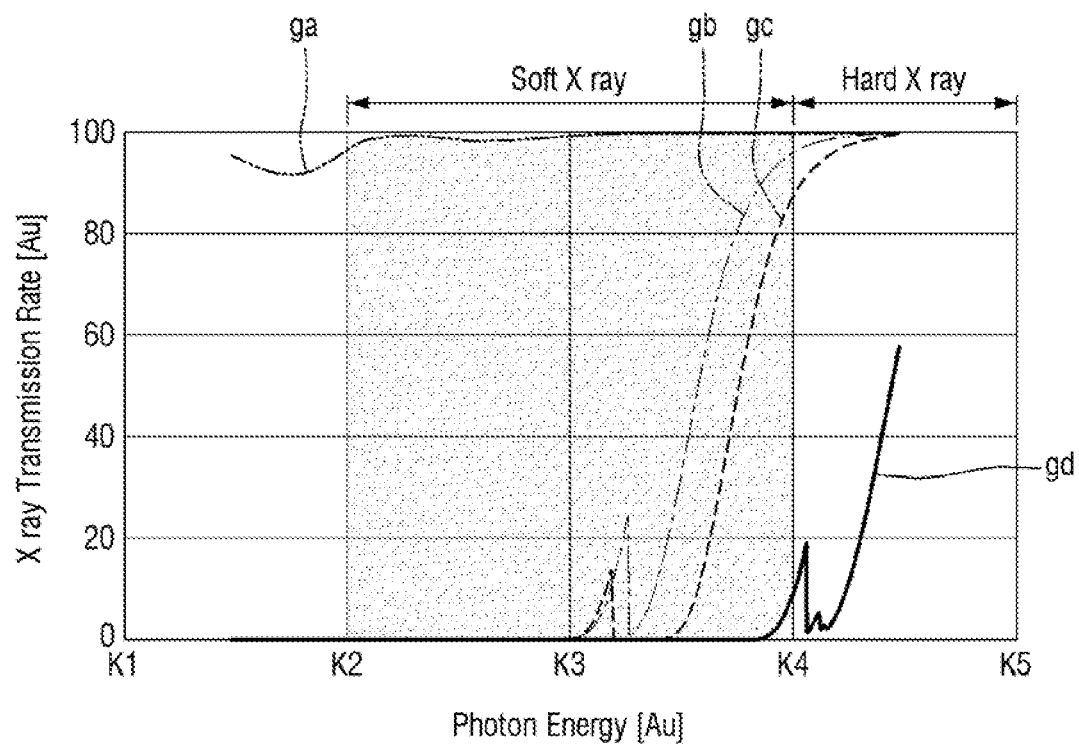
FIG. 4 is a graph illustrating a material of a reflective layer 131 included in the semiconductor package according to some exemplary embodiments of the present inventive concept.

FIG. 3 is a diagram illustrating auxiliary films 131 and 133 included in the semiconductor package according to some exemplary embodiments of the present inventive concept. FIG. 4 is a graph illustrating a material of the reflective layer 131 included in the semiconductor package according to some exemplary embodiments of the present inventive concept.

Referring to FIG. 3, the auxiliary films 131 and 133, according to some exemplary embodiments of the present inventive concept, may selectively transmit the radiation, which is radiated to the auxiliary films 131 and 133, and then to the insulating layer 121.

In some exemplary embodiments of the present inventive concept, the transmittance of soft X-rays (SX) to the reflective layer 131 may be smaller than the transmittance of hard X-rays (HX) to the reflective layer 131. For example, when X-rays are radiated to the reflective layer 131, the rate at which the soft X-rays (SX) pass through the reflective layer 131 may be smaller than the rate at which the hard X-rays (HX) pass through the reflective layer 131.

In some exemplary embodiments of the present inventive concept, the reflective layer 131 may shield the soft x-rays (SX) among X-rays radiated into the semiconductor package, and may transmit the hard X-rays (HX) into the insulating layer 121. For example, the reflective layer 131 shields soft X-rays (SX) among X-rays which are incident on the first protective layer 133 and pass through the first protective layer 133, and may transmit hard X-rays (HX) into the insulating layer 121.

For example, the X-rays radiated to the semiconductor package may be incident on the first protective layer 133 and may pass through the first protective layer 133. However, among the X-rays which are incident on the first protective layer 133 and pass through the first protective layer 133, the soft X-rays (SX) might not be substantially transmitted into the insulating layer 121. For example, the soft X-rays (SX) might not substantially pass through the reflective layer 131. Here, soft X-rays (SX) may be X-rays having photon energy in the range of, for example, about 100 eV to about 10,000 eV.

Referring to FIG. 4, the reflective layer 131, according to some exemplary embodiments of the present inventive concept, may include a metal material having an atomic number greater than 12. For example, the reflective layer 131 may include aluminum, copper, platinum, or nickel.

In some exemplary embodiments of the present inventive concept, the reflective layer 131 may include a ceramic material or an inorganic material. For example, the reflective layer 131 may include tungsten oxide, zinc oxide or antimonious oxide ($Sb_2O_3$).

In some exemplary embodiments of the present inventive concept, the reflective layer 131 may include $BaSO_4$, $(PbCO_3)_2 \cdot Pb(OH)_2$, $TiO_2$, $ZnS$, or $Al_2O_3$.

In the graph of FIG. 4, an x-axis may represent photon energy of X-rays (in units of AU (Arbitrary Unit)), and a y-axis may represent transmittance of X-rays (in units of: AU) of X-rays radiated to the reflective layer 131. In the graph of FIG. 4, X-rays having photon energy within the range of K2 [AU] to K4 [AU] may be, for example, soft X-rays. For example, X-rays having photon energy within the range of K4 [Au] to K5 [Au] may be, for example, hard X-rays.

A first graph (ga) illustrates the transmittance of X-rays directly incident on the semiconductor package when the semiconductor package does not include the reflective layer 131 and the insulating layer 121. Referring to the first graph (ga), the soft X-rays and the hard X-rays may directly pass through the semiconductor package which does not include the reflective layer 131 and the insulating layer 121.

A second graph (gb) illustrates the transmission of X-rays incident on the semiconductor package (for example, the reflective layer 131) when the semiconductor package includes the insulating layer 121 and the reflective layer 131. The reflective layer 131 may contain magnesium having atomic number 12. Referring to the second graph (gb), hard X-rays substantially directly pass through the semiconductor package containing magnesium, and considerable amounts of soft X-rays may pass through the semiconductor package. In a case where the reflective layer 131 contains magnesium having an atomic number of 12, electric charge leakage may occur.

A third graph (gc) illustrates the transmission of X-rays incident on the semiconductor package (for example, the reflective layer 131) when the semiconductor package includes the insulating layer 121 and the reflective layer 131. The reflective layer 131 may contain aluminum having atomic number 13. Referring to the third graph (gc), when the semiconductor package includes the insulating layer 121 and the reflective layer 131 and the reflective layer 131 contains aluminum, transmittance of soft X-rays becomes lower than a case where the reflective layer 131 of the semiconductor package contains magnesium.

A fourth graph (gd) illustrates the transmittance of X-rays incident on the semiconductor package (for example, the reflective layer 131) when the semiconductor package includes the insulating layer 121 and the reflective layer. The reflective layer 131 may contain platinum having atomic number 78. Referring to the fourth graph (gd), when the semiconductor package includes the insulating layer 121 and the reflective layer 131 and the reflective layer 131 contains platinum, the transmittance of soft X-rays substantially approaches 0 as compared to a case where the reflective layer 131 of the semiconductor package contains aluminum.

In the semiconductor package according to some exemplary embodiments of the present inventive concept, at the time of the defect inspection of the semiconductor package, X-rays radiated to the semiconductor package may be selectively made incident into the semiconductor package. Soft X-rays among X-rays used for defect inspection of semiconductor packages may deteriorate characteristics of the semiconductor chip 110. The reflective layer 131 included in the semiconductor package, according to some exemplary embodiments of the present inventive concept, may lower the transmittance of soft X-rays or substantially block the transmission of soft X-rays. Therefore, it is possible to prevent the problem of deterioration of the semiconductor chip 110 which may be caused by X-rays at the time of defect inspection of the semiconductor package.

In addition, in the semiconductor package, according to some exemplary embodiments of the present inventive concept, by disposing the auxiliary films 131 and 133 on the upper part of the semiconductor package, the degree of design freedom of the internal structure of the insulating layer 121 and the semiconductor package may be increased.

Furthermore, in the semiconductor package according to some exemplary embodiments of the present inventive concept, corrosion of the reflective layer 131 can be prevented by including the first protective layer 133 on the reflective layer 131.

Figure 5:
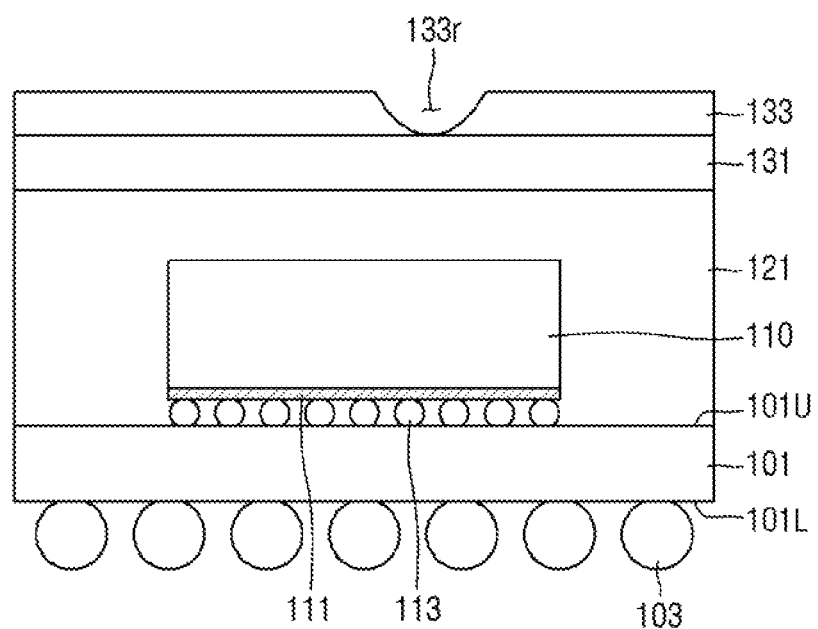
FIG. 5 is a diagram illustrating auxiliary films 131 and 133 included in the semiconductor package according to some exemplary embodiments of the present inventive concept.

FIG. 5 is a diagram illustrating the auxiliary films 131 and 133 included in the semiconductor package according to some exemplary embodiments of the present inventive concept.

Referring to FIG. 5, a recess 133r may be formed in the first protective layer 133 at the time of laser marking on the upper surface of the semiconductor package according to some exemplary embodiments of the present inventive concept. For example, the laser radiated to the auxiliary films 131 and 133 might not be incident on the reflective layer 131. For example, the reflective layer 131 might not transmit the laser radiated to the first protective layer 133 into the insulating layer 121.

The recess 133r formed by laser marking may be formed in the first protective layer 133. The recess 133r formed by laser marking may be formed in the first protective layer 133 to expose the upper surface of the reflecting layer 131. In this case, due to the first protective layer 133 being formed with a thickness sufficient for laser marking, the laser might not be incident on the reflective layer 131. For example, the laser marking for the semiconductor package may be performed on only the first protective layer 133.

Since the semiconductor package, according to some exemplary embodiments of the present inventive concept, includes the first protective layer 133 disposed on the reflective layer 131, corrosion of the reflective layer 131 may be prevented and loss of the reflective layer 131 may be prevented at the time of laser marking. In addition, since the laser marking is performed on only the first protective layer 133, the overall thickness of the semiconductor package may be reduced. Furthermore, since the first protective layer 133 may prevent the loss of the insulating layer 121 and may protect the semiconductor chip 110 and the like buried inside the insulating layer 121, the degree of design freedom of the package may be increased.

Hereinafter, the semiconductor package according to some exemplary embodiments of the present inventive concept will be described with reference to FIG. 6. For the sake of clarity of explanation, repeated description will be simplified or omitted and it may be assumed that the omitted description is at least similar to that of corresponding elements that have already been described.

Figure 6:
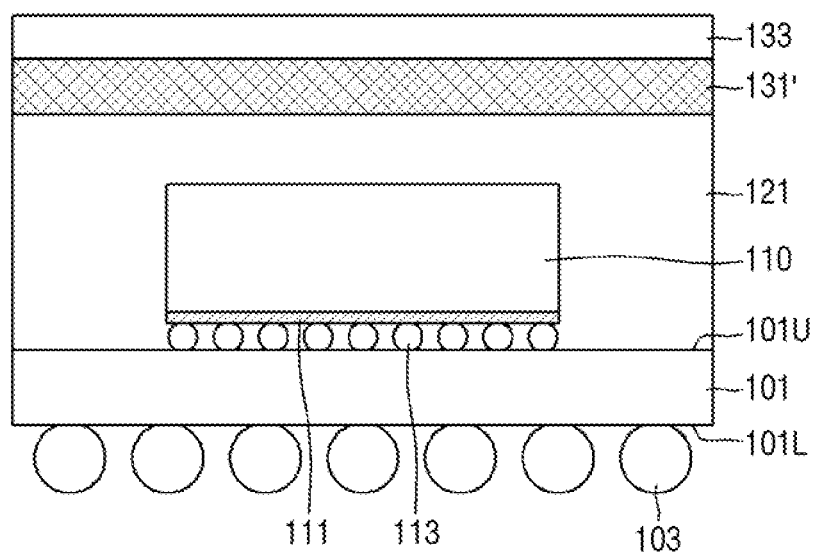
FIG. 6 is a cross-sectional view taken along line A-A' of FIG. 1.

FIG. 6 is a cross-sectional view taken along line A-A' of FIG. 1.

Referring to FIG. 6, in some exemplary embodiments of the present inventive concept, a reflective layer 131' may be a woven metal net. In some exemplary embodiments of the present inventive concept, the reflective layer 131' may be a woven metal net and may include a resin. In some exemplary embodiments of the present inventive concept, for example, when the reflective layer 131' is a woven metal net including a resin, for example, the first protective layer 133 may be omitted and it may be assumed that the omitted description is at least similar to that of corresponding elements that have already been described.

When the reflective layer 131' is a woven metal net, the adhesive force between the insulating layer 121 and the reflective layer 131' can be increased.

Hereinafter, the semiconductor package according to some exemplary embodiments of the present inventive concept will be described with reference to FIG. 7. For the sake of clarity of explanation, repeated description will be simplified or omitted and it may be assumed that the omitted description is at least similar to that of corresponding elements that have already been described.

Figure 7:
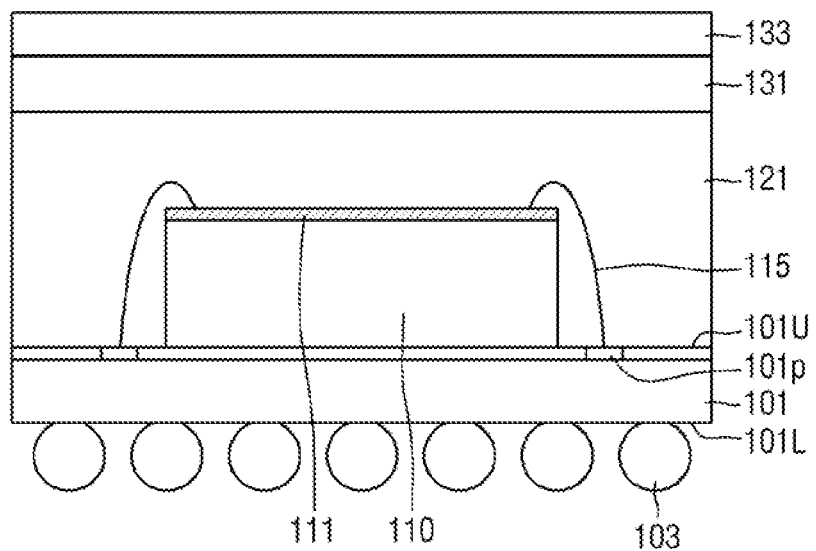
FIG. 7 is a cross-sectional view taken along line A-A' of FIG. 1.

FIG. 7 is a cross-sectional view taken along line A-A' of FIG. 1.

Referring to FIG. 7, the semiconductor chip 110 buried inside the insulating layer 121 may be electrically connected to the semiconductor package substrate 101 through the second connection element 115. The semiconductor chip 110 may be mounted on the semiconductor package substrate 101 by, for example, a wire bonding method. The upper surface of the semiconductor chip 110 may be a semiconductor element circuit region 111.

The second connection element 115 may connect the semiconductor element circuit region 111 of the semiconductor chip 110 and a pad 101p.

The pad 101p may be formed on the upper surface 101U of the semiconductor package substrate 101. In the drawings, the upper surface of the pad 101p is illustrated as being on the same plane as the upper surface 101U of the semiconductor package substrate 101, but the technical idea of the present inventive concept is not limited thereto. For example, the upper surface of the pad 101p may protrude from the upper surface 101U of the semiconductor package substrate 101.

The insulating layer 121 may completely fill the gap between the semiconductor chip 110 and the second connection element 115. The insulating layer 121 may completely cover the second connection element 115. The semiconductor chip 110 and the second connection element 115 may be completely buried inside the insulating layer 121.

Although one semiconductor chip 110 is illustrated as being mounted on the semiconductor package substrate 101 in FIG. 7, the technical idea of the present inventive concept is not limited thereto. For example, a plurality of semiconductor chips 110 may be mounted on the semiconductor package substrate 101.

Hereinafter, the semiconductor package according to some exemplary embodiments of the present inventive concept will be described with reference to FIG. 8. For the sake of clarity of explanation, repeated description will be simplified or omitted and it may be assumed that the omitted description is at least similar to that of corresponding elements that have already been described.

Figure 8:
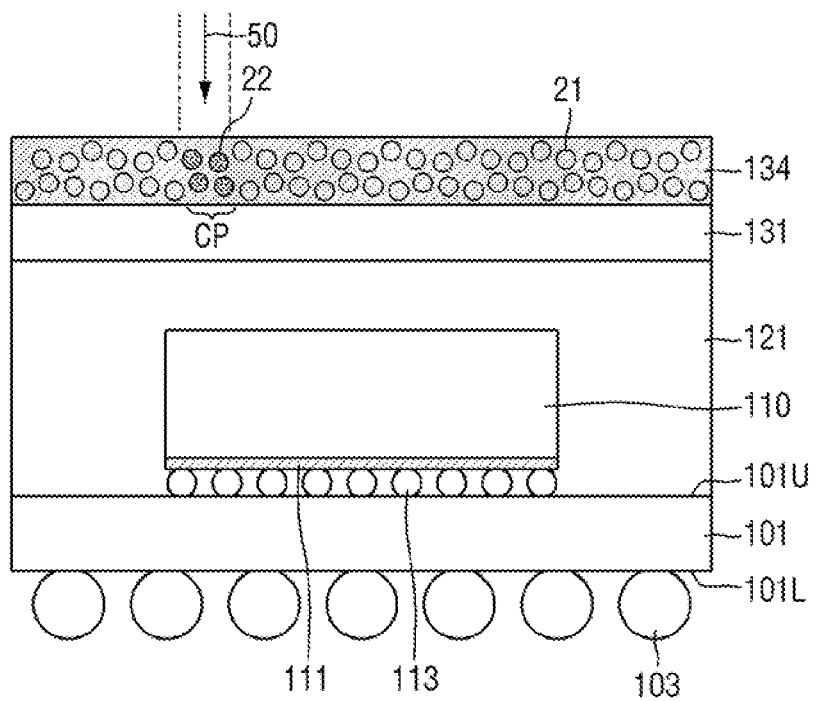
FIGS. 8, 9, 10, 11a, 11b, 11c, 12, 13, 14, 15, and 16 are cross-sectional views illustrating the semiconductor package according to some exemplary embodiments of the present inventive concept, respectively.

FIG. 8 is a diagram illustrating the semiconductor package according to some exemplary embodiments of the present inventive concept. FIG. 8 may be, for example, a cross-sectional view taken along the line A-A' of FIG. 1.

Referring to FIG. 8, the semiconductor package, according to some exemplary embodiments of the present inventive concept, may include a second protective layer 134. For example, an auxiliary film according to the technical idea of the present inventive concept may include a reflective layer 131 and a second protective layer 134.

The second protective layer 134 may include a thermochromic material and/or a photochromic material. The thermochromic material and/or the photochromic material may include a leucodye. The thermochromic material is a conjugated system of an electron donating material or an electron accepting material, which can change the structure at a particular temperature (e.g., room temperature) to develop color. In some cases, the thermochromic material reversibly develops color, and may induce an irreversible color development through a color developer, a sensitizer, or an addition reaction.

For example, leuco dye may include xanthene leuco dye, thioxanthene leuco dye, acridine leuco dye, phenoxazine leuco dye, phenazine leuco dye, merocyanine leuco dye, thiazine leuco dye, oxazine leuco dye, azine leuco dye, methane leuco dye, azo leuco dye, pyrazoline leuco dye, stilbene leuco dye, coumarin leuco dye, triarylmethane leuco dye, spiropyran leuco dye, phthalide leuco dye, fluoran leuco dye, acyl leuco dye, auramine leuco dye, rhodamine-lactam leuco dye, chromene leuco dye, quinine leuco dye, amino hydrocinnamic acid leuco dye, 2-(p-hydroxyphenyl)-4,5-diphenylimidazole leuco dye, indanone leuco dye, indamine leuco dye, hydrazine leuco dye, indigoid leuco dye, amino-2,3-dihydroanthraquinone leuco dye, tetrahalo-p,p'-biphenol leuco dye, phenylethyl aniline leuco dye, or mixtures thereof.

The second protective layer 134 may further include a color developer to implement various colors. The color developer may include crystal violet lactone, malachite green lactone, bis-indolyl phthalide dye, diamino fluoran dye or xanthene dye. By freely adjusting the color of the first protective layer 133 through the color developer, a desired aesthetic may be achieved.

The second protective layer 134 may further include a light stabilizer and/or a sensitizer. The stability of the thermochromic material and/or the photochromic material can be enhanced through the light stabilizer. The coloring temperature of the second protective layer 134 can be adjusted or the discoloration efficiency can be increased through the sensitizer.

The thermochromic material and/or the photochromic material may have a crystal structure including first crystal grains 21. The first crystal grains 21 may be uniformly dispersed in the second protective layer 134.

When the auxiliary films 131 and 134 are irradiated with the laser 50, the thermochromic material and/or the photochromic material under the region irradiated with the laser 50 reacts with the laser, and the color may change. For example, discolored crystal grains 22 may be formed from the first crystal grains 21. In this way, a discolored region (CP) that can be identified by the user may be formed in the second protective layer 134. From the viewpoint of a plane, the discolored region (CP) may display, for example, information of the semiconductor package. When laser 50 is used, energy of laser 50 may be transmitted only to a specific region.

The radiated laser 50 only induces the reaction of the second protective layer 134, and is reflected by the reflective layer 131 and might not pass through the second protective layer 134. Therefore, energy of the laser 50 might not be transferred to the insulating layer 121 or the semiconductor chip 110.

The second protective layer 134 may have a surface gloss resulting from, for example, the thermochromic material and/or the photochromic material. Alternatively, the second protective layer 134 may have gloss on its surface by including a brightener.

Alternatively, the second protective layer 134 may include reinforcements. When the second protective layer 134 contains the reinforcements, the mechanical strength (such as tensile strength) of the auxiliary films 131 and 134 can be increased. The reinforcements may be, for example, glass fiber. In some exemplary embodiments of the present inventive concept, the auxiliary films 131 and 134 may further include a reinforcing layer for increasing the mechanical strength, and the reinforcements may be included in the reinforcing layer.

In the semiconductor package according to some exemplary embodiments of the present inventive concept, by disposing the auxiliary films 131 and 134 on the insulating layer 121, it is possible to protect the semiconductor chip 110 and efficiently perform the marking process at the same time. Since the thickness of the insulating layer 121 is reduced, the overall thickness of the semiconductor package can be further reduced. Further, by increasing the thickness of the second protective layer 134 or by adding the reinforcements, the mechanical strength of the auxiliary films 131 and 134 can be enhanced. When the mechanical strength of the auxiliary films 131 and 134 is enhanced, the auxiliary films 131 and 134 may prevent the semiconductor package from warping. Also, by adjusting the thermochromic material and/or the photochromic material in the second protective layer 134, gloss may be imparted to the surface of the semiconductor package. Further, by adjusting the thermochromic material and/or the photochromic material in the second protective layer 134, it is possible to freely adjust the colors of the second protective layer 134 and the color changing region (CP).

Hereinafter, the semiconductor package, according to some exemplary embodiments of the present inventive concept, will be described with reference to FIG. 9. For the sake of clarity of explanation, repeated description will be simplified or omitted and it may be assumed that the omitted description is at least similar to that of corresponding elements that have already been described.

Figure 9:
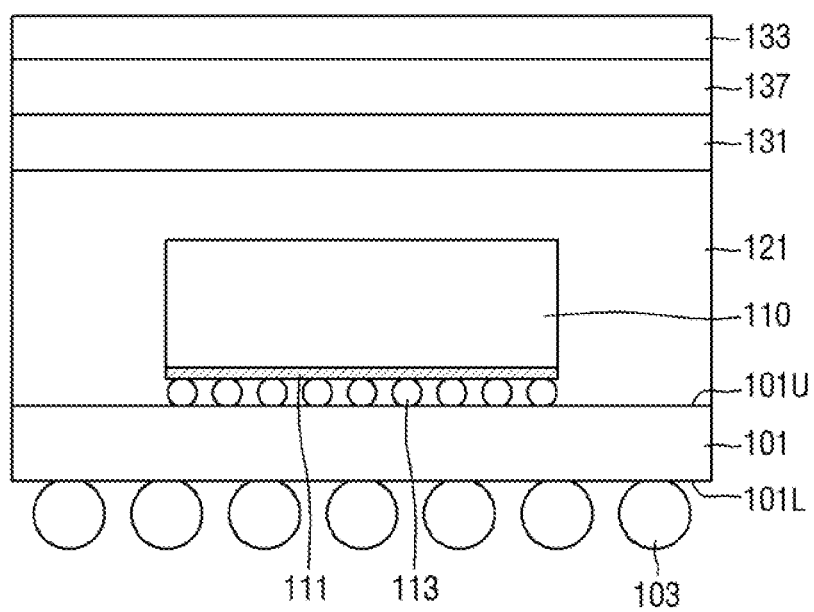

FIG. 9 is a diagram illustrating the semiconductor package according to some exemplary embodiments of the present inventive concept.

Referring to FIG. 9, the semiconductor package, according to some exemplary embodiments of the present inventive concept, may further include a first insertion layer 137.

For example, the auxiliary film, according to the technical idea of the present inventive concept, may include a reflective layer 131, a first insertion layer 137 and a first protective layer 133.

The first insertion layer 137 may be interposed between the reflective layer 131 and the first protective layer 133. The first insertion layer 137 may reflect, for example, the laser radiated to the semiconductor package. The first insertion layer 137 may allow, for example, X-rays radiated to the semiconductor package to pass therethrough.

In some exemplary embodiments of the present inventive concept, a second protective layer (134 of FIG. 7) may be disposed instead of the first protective layer 133 on the first insertion layer 137.

Hereinafter, the semiconductor package according to some exemplary embodiments of the present inventive concept will be described with reference to FIG. 10. For the sake of clarity of explanation, repeated description will be simplified or omitted and it may be assumed that the omitted description is at least similar to that of corresponding elements that have already been described.

Figure 10:
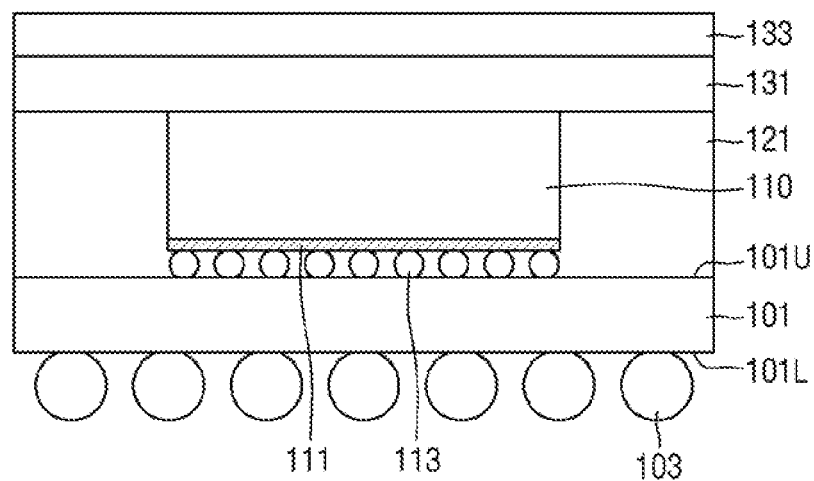

FIG. 10 is a diagram illustrating the semiconductor package according to some exemplary embodiments of the present inventive concept. FIG. 10 may be, for example, a cross-sectional view taken along the line A-A' of FIG. 1.

Referring to FIG. 10, the semiconductor chip 110 of the semiconductor package, according to some exemplary embodiments of the present inventive concept, may be in direct contact with the reflective layer 131. For example, the insulating layer 121 might not be interposed between the semiconductor chip 110 and the reflective layer 131.

When the semiconductor chip 110 is in direct contact with the reflective layer 131, the overall thickness of the semiconductor package may be reduced.

The semiconductor package, according to some exemplary embodiments of the present inventive concept, will be described below with reference to FIGS. 11a to 11c. For the sake of clarity of explanation, repeated description will be simplified or omitted and it may be assumed that the omitted description is at least similar to that of corresponding elements that have already been described.

Figure 11A:
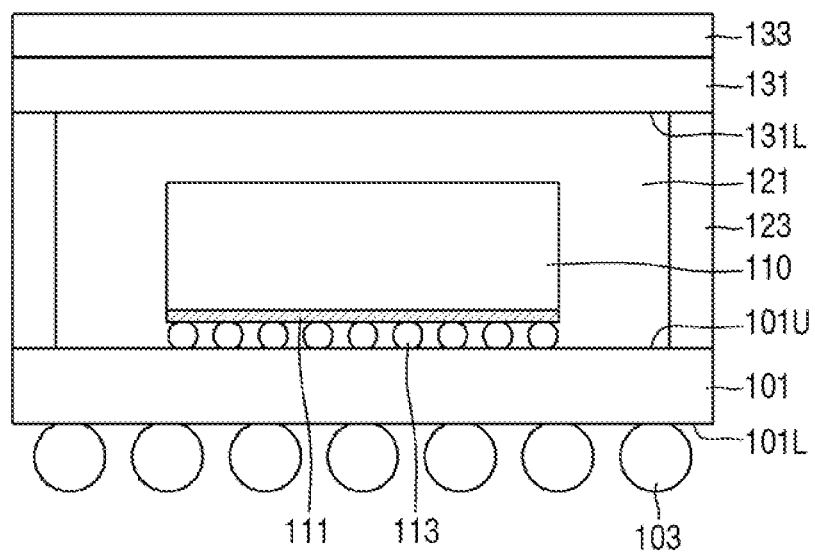
Figure 11B:
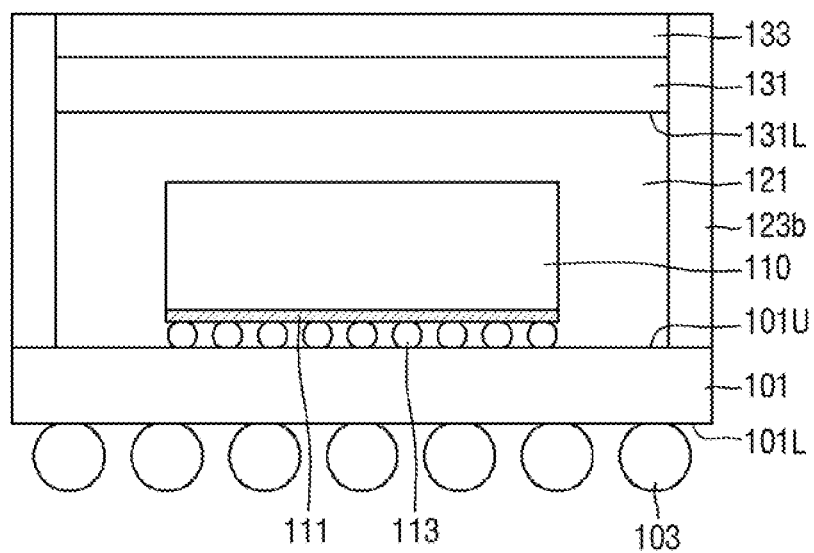
Figure 11C:
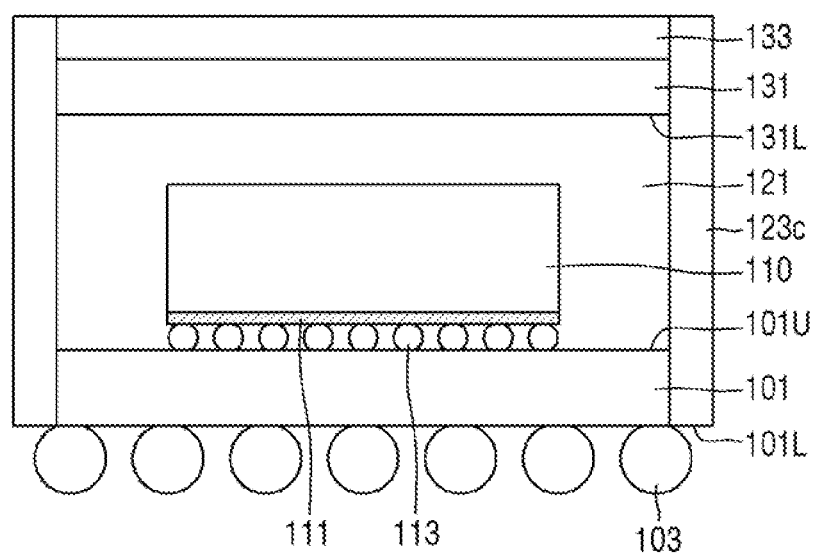

FIGS. 11a to 11c are diagrams illustrating the semiconductor package according to some exemplary embodiments of the present inventive concept. Each of FIGS. 11a to 11c may be, for example, cross-sectional views taken along the line A-A' of FIG. 1.

Referring to FIGS. 11a to 11c, the semiconductor package according to some exemplary embodiments of the present inventive concept may further include shielding layers 123a, 123b, and 123c.

The shielding layers 123a, 123b, and 123c may be disposed between the semiconductor package substrate 101 and the reflective layer 131. The shielding layers 123a, 123b, and 123c may wrap around the insulating layer 121. The shielding layers 123a, 123b, and 123c may be disposed on the semiconductor package substrate 101 and spaced apart from the semiconductor chip 110.

In the embodiment of FIG. 11a, the shielding layer 123a may extend from an upper surface 101U of the semiconductor package substrate 101 to a lower surface 131L of the reflective layer 131. The upper surface of the shielding layer 123a may be in contact with the lower surface 131L of the reflective layer 131, and the lower surface of the shielding layer 123a may be in contact with lower surface 101L of the semiconductor package substrate 101. Further, the side surface of the shielding layer 123a may be in contact with the side surface of the insulating layer 121.

In the embodiment of FIG. 11b, the shielding layer 123b may extend through the auxiliary films 131 and 133. When the shielding layer 123b extends through the auxiliary films 131 and 133, the upper surface of the shielding layer 123b may be on the substantially same plane as the upper surface of the first protective layer 133.

In the embodiment of FIG. 11c, the shielding layer 123c may extend through the auxiliary films 131 and 133 and the semiconductor package substrate 101. When the shielding layer 123c extends through the auxiliary films 131 and 133 and the semiconductor package substrate 101, the upper surface of the shielding layer 123c may be on the substantially same plane as the upper surface of the first protective layer 133, and the lower surface of the shielding layer 123c may be on the substantially same plane as the lower surface 101L of the semiconductor package substrate 101. The semiconductor package including the shielding layer 123c extending through the auxiliary films 131 and 133 and the semiconductor package substrate 101 may be formed by performing, for example, a sputtering process, a spraying process, and/or a dipping process on the semiconductor package of FIG. 2 to form the shielding layer 123c.

The shielding layers 123a, 123b, and 123c may block EMI (Electro Magnetic Interference) to protect the characteristics of the semiconductor chip 110.

In some exemplary embodiments of the present inventive concept, the shielding layer 123a, 123b, 123c may include a different material from that of the reflective layer 131. Or in some exemplary embodiments of the present inventive concept, the shielding layer 123a, 123b, 123c may include the same material as that of the reflective layer 131. The shielding layers 123a, 123b, and 123c may include, for example, silver (Ag), but the technical idea of the present inventive concept is not limited thereto.

Electrical signals may be applied to the semiconductor package substrate 101. The electrical signal applied to the semiconductor package substrate 101 may be transferred to the reflective layer 131, for example, through the shielding layers 123a, 123b, and 123c.

For example, the semiconductor package substrate 101 may be connected to the ground voltage. When the semiconductor package substrate 101 is connected to the ground voltage, the shielding layers 123a, 123b, and 123c may electrically connect the ground voltage and the reflective layer 131.

Hereinafter, the semiconductor package according to some exemplary embodiments of the present inventive concept will be described with reference to FIG. 12. For the sake of clarity of explanation, repeated description will be simplified or omitted and it may be assumed that the omitted description is at least similar to that of corresponding elements that have already been described.

Figure 12:
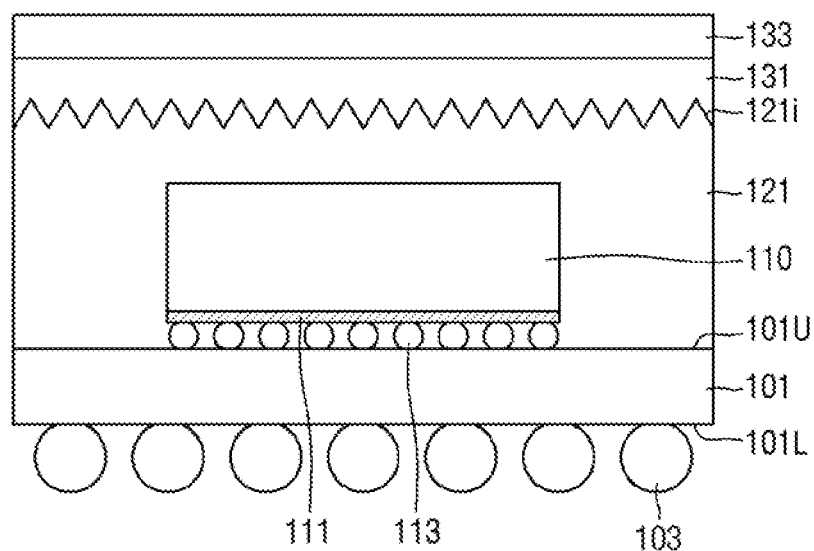

FIG. 12 is a diagram illustrating the semiconductor package according to some exemplary embodiments of the present inventive concept. FIG. 12 may be, for example, a cross-sectional view taken along the line A-A' of FIG. 1.

Referring to FIG. 12, a boundary surface 121i between the insulating layer 121 and the reflective layer 131 included in the semiconductor package, according to some exemplary embodiments of the present inventive concept, might not be flat.

For example, the lower surface of the reflective layer 131 might not be flat. For example, the lower surface of the reflective layer 131 may have irregularities. For example, the upper surface of the insulating layer 121 might not be flat. For example, the upper surface of the insulating layer 121 may have irregularities. An average roughness (Ra) of the interface 121i between the insulating layer 121 and the reflective layer 131 may be, for example, greater than 0.3.

Since the boundary surface 121i between the insulating layer 121 and the reflective layer 131 is not flat, the adhesive force between the insulating layer 121 and the reflective layer 131 may be increased.

Hereinafter, the semiconductor package, according to some exemplary embodiments of the present inventive concept, will be described with reference to FIG. 13. For the sake of clarity of explanation, repeated description will be simplified or omitted and it may be assumed that the omitted description is at least similar to that of corresponding elements that have already been described.

Figure 13:
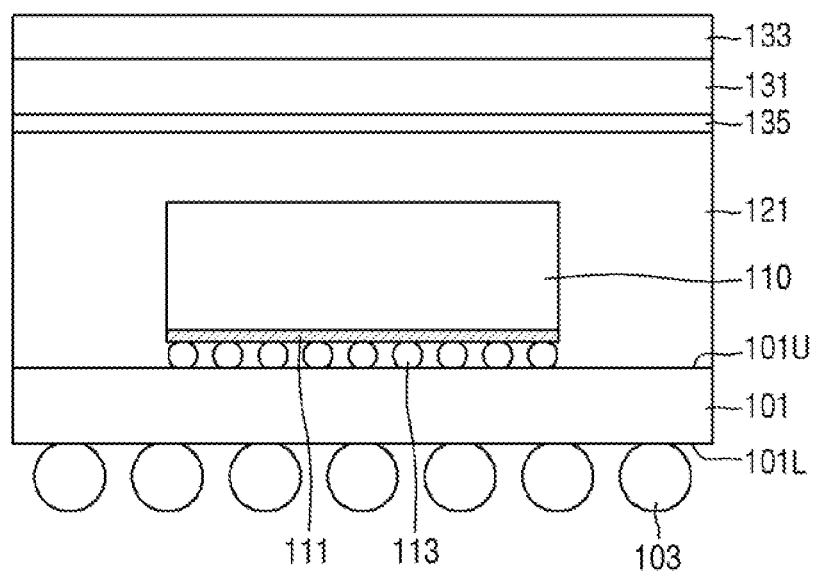

FIG. 13 is a diagram illustrating the semiconductor package according to some exemplary embodiments of the present inventive concept. Referring to FIG. 13, the semiconductor package, according to some exemplary embodiments of the present inventive concept, may further include a second insertion layer 135. The second insertion layer 135 may be interposed between the insulating layer 121 and the reflective layer 131.

In some exemplary embodiments of the present inventive concept, the second insert layer 135 may include an adhesive material. When the second insertion layer 135 includes the adhesive material, the reflective layer 131 may be attached to the top of the insulating layer 121 through the second insertion layer 135.

In some exemplary embodiments of the present inventive concept, the second insertion layer 135 may include a material capable of blocking electron transfer from the reflective layer 131 to the insulating layer 121.

Hereinafter, the semiconductor package according to some exemplary embodiments of the present inventive concept will be described with reference to FIG. 14. For the sake of clarity of explanation, repeated description will be simplified or omitted and it may be assumed that the omitted description is at least similar to that of corresponding elements that have already been described.

Figure 14:
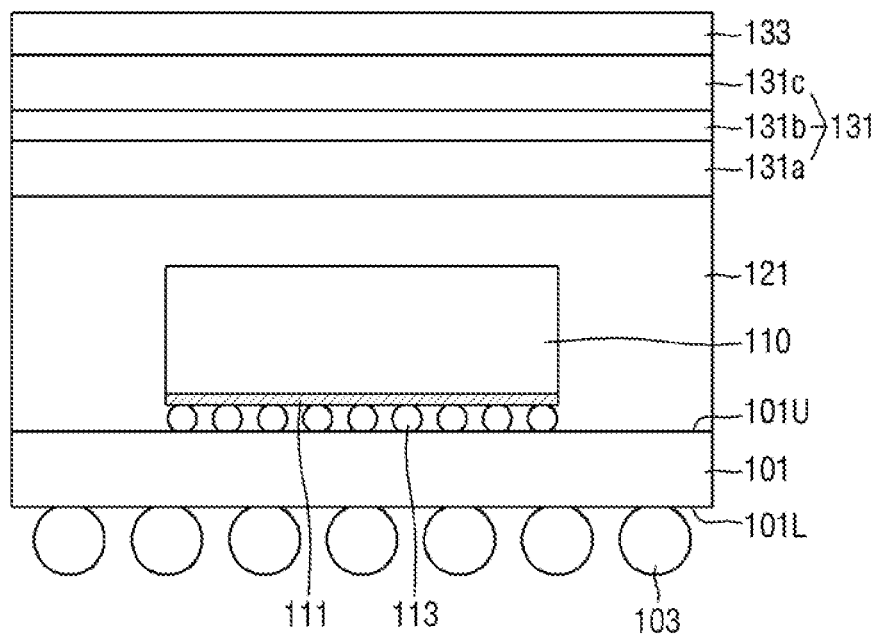

FIG. 14 is a diagram illustrating the semiconductor package according to some exemplary embodiments of the present inventive concept. Referring to FIG. 14, the reflective layer 131 of the semiconductor package, according to some exemplary embodiments of the present inventive concept, includes a first reflective layer 131a, an adhesion layer 131b, and a second reflective layer 131c. The first reflective layer 131a may be disposed on the insulating layer 121. The second reflective layer 131c may be disposed on the first reflective layer 131a. The adhesive layer 131b may be interposed between the first reflective layer 131a and the second reflective layer 131c.

For example, the atomic number of the substance contained in the first reflective layer 131a may be larger than the atomic number of the substance contained in the second reflective layer 131c. The adhesive layer 131b may include an adhesive substance. The first reflective layer 131a and the second reflective layer 131c may be attached to each other through the adhesive layer 131b.

Hereinafter, the semiconductor package according to some exemplary embodiments of the present inventive concept will be described with reference to FIG. 15. For the sake of clarity of explanation, repeated description will be simplified or omitted and it may be assumed that the omitted description is at least similar to that of corresponding elements that have already been described.

Figure 15:
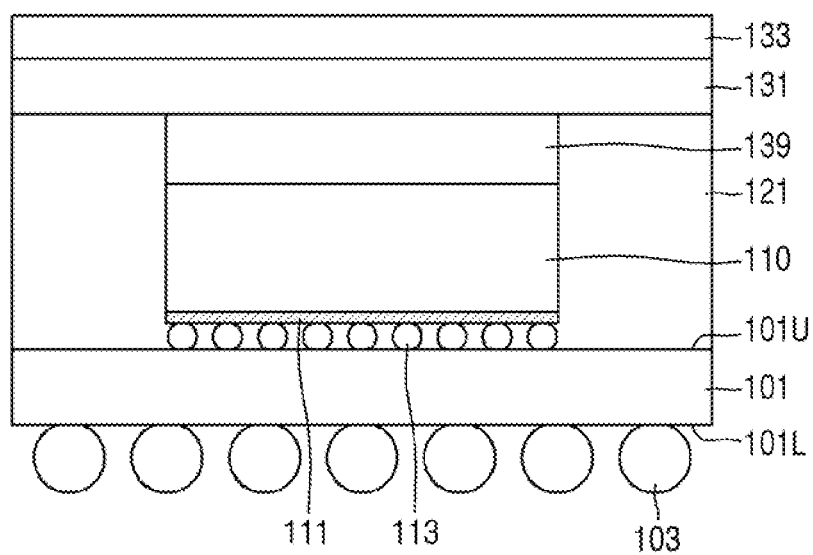

FIG. 15 is a diagram illustrating the semiconductor package according to some exemplary embodiments of the present inventive concept.

Referring to FIG. 15, the semiconductor package according to some exemplary embodiments of the present inventive concept may further include a heat transfer material layer 139. The heat transfer material layer 139 may be disposed in the insulating layer 121 between the semiconductor chip 110 and the reflective layer 131. The heat transfer material layer 139 may be interposed between the semiconductor chip 110 and the reflective layer 131.

The heat transfer material layer 139 may be, for example, TIM (Thermal Interface Material).

In the drawings, the heat transfer material layer 139 is illustrated as being disposed only between the semiconductor chip 110 and the reflective layer 131, but the technical idea of the present inventive concept is limited thereto. For example, the heat transfer material layer 139 may be arranged between the side surface of the semiconductor chip 110 and the insulating layer 121. Alternatively, for example, the heat transfer material layer 139 may be arranged on only a part of the upper surface of the semiconductor chip 110.

The semiconductor package according to some exemplary embodiments of the present inventive concept may efficiently discharge heat, which is generated from the semiconductor chip 110, to the outside of the semiconductor package, by further including the heat transfer material layer 139.

Hereinafter, the semiconductor package, according to some exemplary embodiments of the present inventive concept, will be described with reference to FIG. 16. For the sake of clarity of explanation, repeated description will be simplified or omitted and it may be assumed that the omitted description is at least similar to that of corresponding elements that have already been described.

Figure 16:
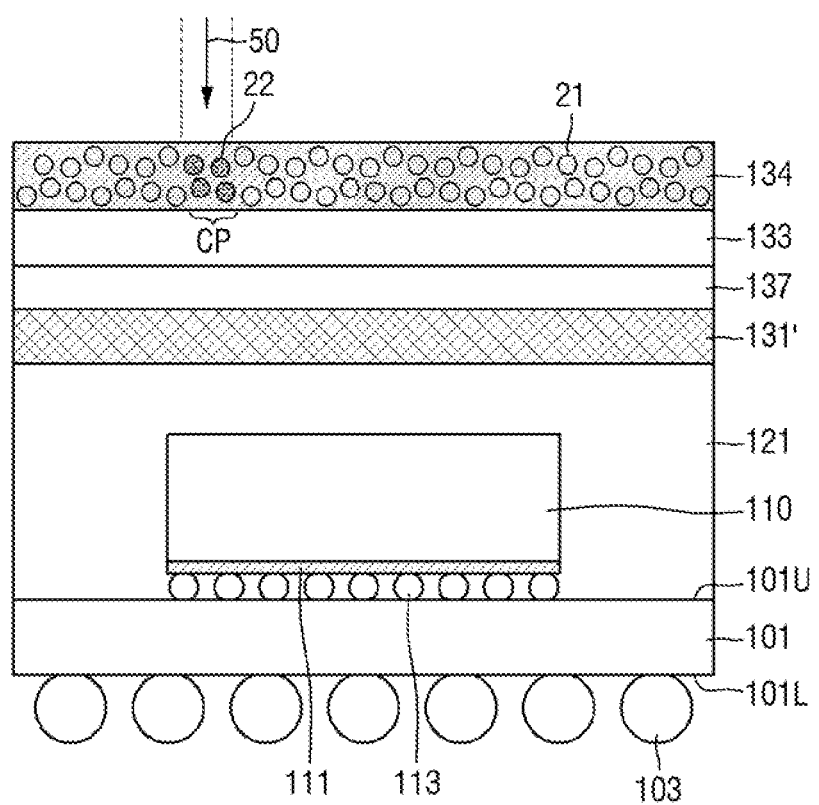

FIG. 16 is a diagram illustrating the semiconductor package according to some exemplary embodiments of the present inventive concept.

Referring to FIG. 16, the semiconductor package, according to some exemplary embodiments of the present inventive concept, may include an auxiliary film including a reflective layer 131', a first insertion layer 137, a first protective layer 133, and a second protective layer 134.

In some exemplary embodiments of the present inventive concept, the reflective layer 131' may be, for example, a woven metal net.

In the drawing, the reflective layer 131', the first insertion layer 137, the first protective layer 133, and the second protective layer 134 are illustrated as being sequentially stacked, but the inventive concept is not limited thereto. For example, the stacking order of the reflective layer 131', the first insertion layer 137, the first protective layer 133 and the second protective layer 134 may be change. For example, the reflective layer 131', the first insertion layer 137, the second protective layer 134, and the first protective layer 133 may be sequentially stacked.

Hereinafter, a method for manufacturing the semiconductor package according to some exemplary embodiments of the present inventive concept will be described with reference to FIGS. 2, 17 and 18. For the sake of clarity of explanation, repeated description will be simplified or omitted and it may be assumed that the omitted description is at least similar to that of corresponding elements that have already been described.

Figure 17:
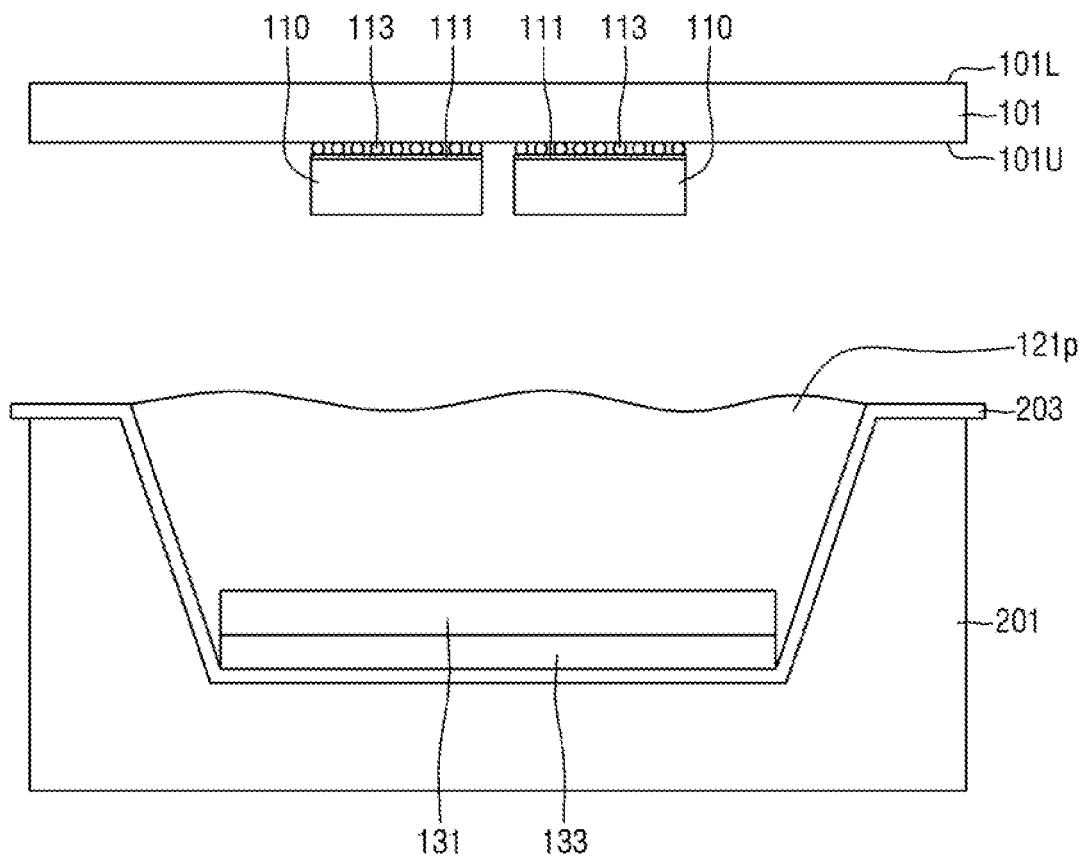
FIGS. 17 to 27 are intermediate step diagrams illustrating a method for manufacturing the semiconductor package according to some exemplary embodiments of the present inventive concept.
Figure 18:
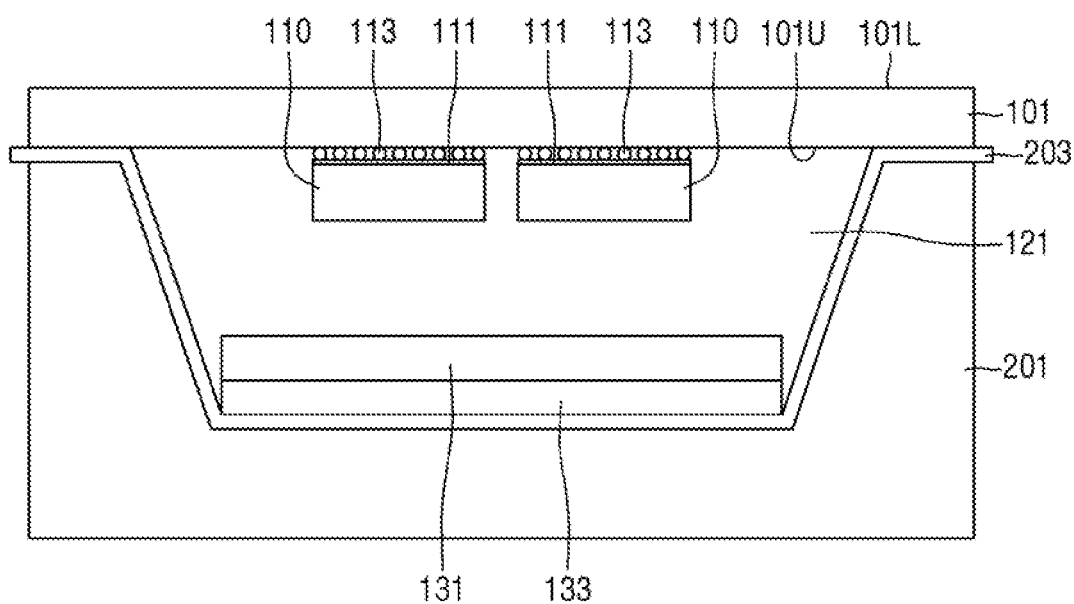

FIGS. 17 and 18 are intermediate stage diagrams illustrating the method for manufacturing the semiconductor package according to some exemplary embodiments of the present inventive concept.

Referring to FIG. 17, the reflective layer 131 and the first protective layer 133 may be attached to a release film 203.

The release film 203 may be attached onto a first support table 201 to facilitate releasing of a molded article after molding and to leave no residues in the mold. An insulating material 121p may be disposed on the release film 203 and the reflective layer 131.

The first support table 201 may be, for example, a die mold.

The release film 203 may include, for example, a base film and/or a release layer.

When the release film 203 includes both the base film and the release layer, the base film and the release layer may be sequentially stacked on the first support table 201. Here, the release layer may be a layer for separating the auxiliary films 131 and 133 from the base film. The base film may support the release layer, the first protective layer 133 and the reflective layer 131.

The base film may include, for example, but is not limited to, polyethylene terephthalate, polyethylene (PE), polypropylene (PP), polymethyl methacrylate (PMMA), polycarbonate (PC), polyurethane (PU), polytetrafluoroethylene (PTFE), ethylene-polytetrafluoroethylene (ETFE), or mixtures thereof.

The release layer may include, but is not limited to, a silicon-based release agent, an epoxy-based release agent, or a fluorine-based release agent.

In some exemplary embodiments of the present inventive concept, a semiconductor package substrate 101 having a plurality of semiconductor chips 110 mounted thereon may be located on the insulating material 121p and may be spaced apart from the insulating material 121p. The semiconductor package substrate 101 may be arranged so that the semiconductor chip 110 faces the insulating material 121p. For example, the upper surface 101U of the semiconductor package substrate 101 may face the insulating material 121p. The insulating material 121p, for example, may be an epoxy molding compound.

In the drawings, the first protective layer 133 and the reflective layer 131 are illustrated as extending along only a part of the release film 203, but the present inventive concept is not limited thereto. For example, the first protective layer 133 and/or the reflective layer 131 may extend along the profile of the release film 203 on the release film 203.

Referring to FIG. 18, the insulating layer 121 may be formed. For example, pressure may be applied to the lower surface 101L of the semiconductor package substrate 101 which is separated from the insulating material (121p of FIG. 17). By the pressure, the semiconductor chip 110 may be inserted into the insulating material (121p of FIG. 17). A vacuum state may be maintained between the semiconductor package substrate 101 and the insulating material (121p of FIG. 17) and between the plurality of semiconductor chips 110 and the insulating material (121p of FIG. 17). The plurality of semiconductor chips 110 may be completely inserted into the insulating material (121p of FIG. 17), and the insulating layer 121 may be formed. Thus, the plurality of semiconductor chips 110 may be buried in the insulating layer 121.

A part of the release film 203 may be in contact with a part of the upper surface 101U of the semiconductor package substrate 101.

Thereafter, the release film 203 and the first support table 201 may be removed. After the release film 203 and the first support table 201 are removed, the width of the insulating layer 121 and the width of the semiconductor package substrate 101 may be the same as the respective widths of the reflective layer 131 and the first protective layer 133, through a singulation process or the like.

The external connection terminal 103 is attached to the semiconductor package substrate 101 from which the release film 203 and the first support table 201 are removed, and thus, the semiconductor package of FIG. 2 may be formed.

In the method for manufacturing the semiconductor package according to some exemplary embodiments of the present inventive concept, by attaching the reflective layer 131 and the first protective layer 133 to the release film 203 to mold a plurality of semiconductor chips 110, it is possible to reduce the complexity of the manufacturing process of the semiconductor package.

Further, in the method for manufacturing the semiconductor package according to some exemplary embodiments of the present inventive concept, by simultaneously performing a molding process on each of a plurality of semiconductor chips 110, it is possible to reduce the complexity of the manufacturing process of the semiconductor package.

Hereinafter, the method for manufacturing the semiconductor package according to some exemplary embodiments of the present inventive concept will be described with reference to FIGS. 2, 18 and, 19. For the sake of clarity of explanation, repeated description will be simplified or omitted and it may be assumed that the omitted description is at least similar to that of corresponding elements that have already been described.

Figure 19:
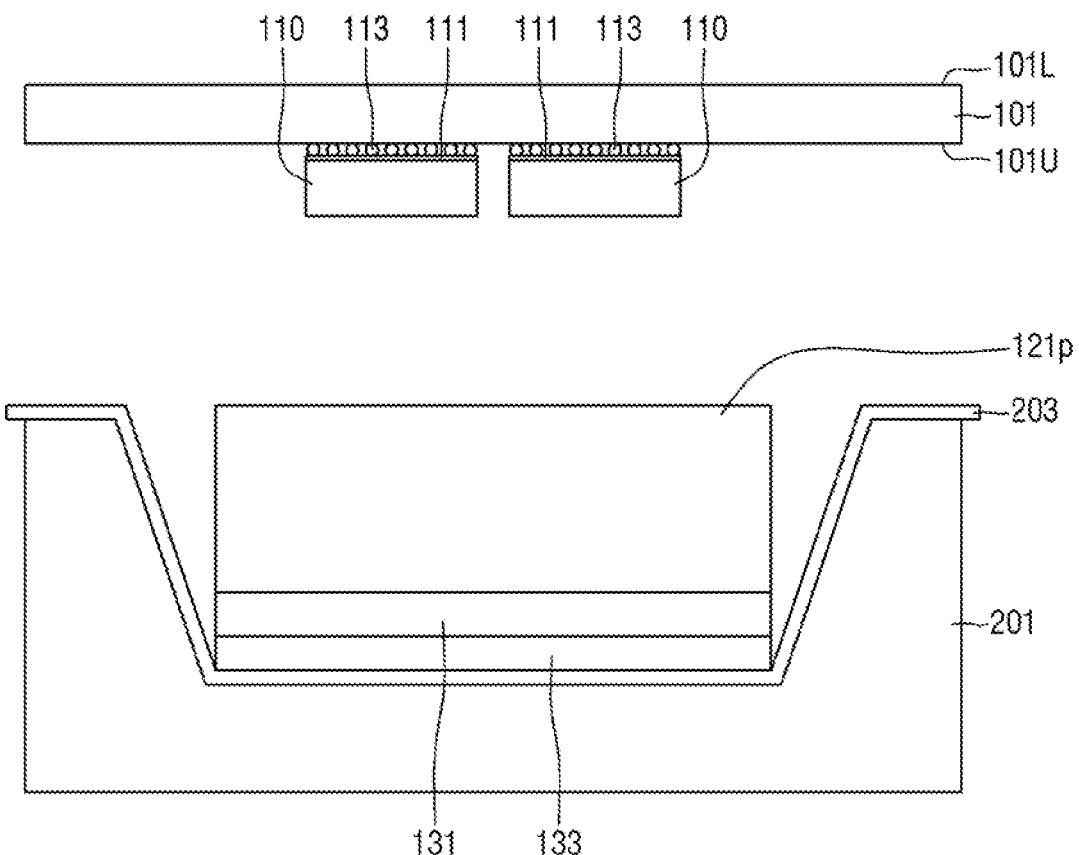

FIG. 19 is an intermediate step diagram illustrating the method for manufacturing the semiconductor package according to some exemplary embodiments of the present inventive concept.

Referring to FIG. 19, the insulating material 121p may be disposed on only the reflective layer 131 and the first protective layer 133. For example, the width of the insulating material 121p may be substantially the same as the width of each of the reflective layer 131 and the first protective layer 133.

Referring to FIG. 18, the insulating layer 121 may be formed.

Hereinafter, the method for manufacturing the semiconductor package according to some exemplary embodiments of the present inventive concept will be described with reference to FIGS. 2, 20 and 21. For the sake of clarity of explanation, repeated description will be simplified or omitted and it may be assumed that the omitted description is at least similar to that of corresponding elements that have already been described.

Figure 20:
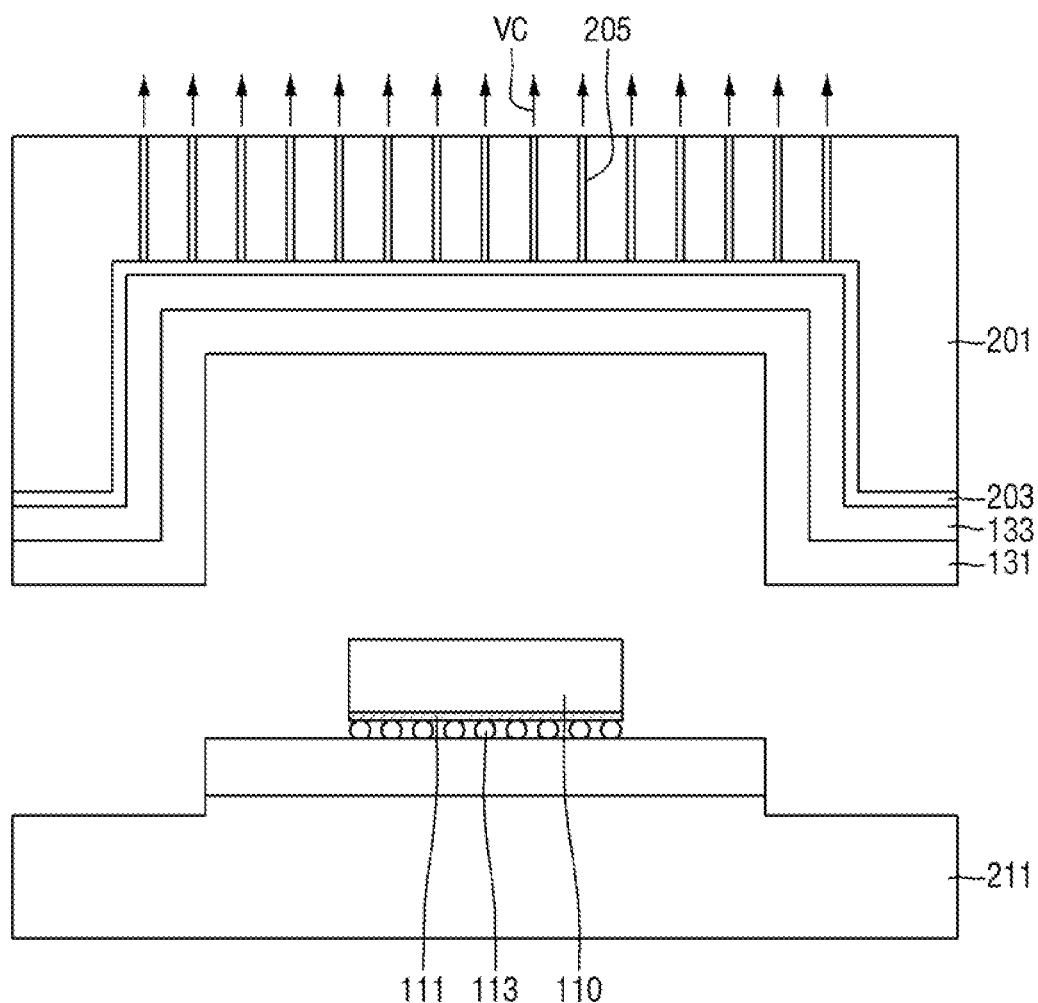
Figure 21:
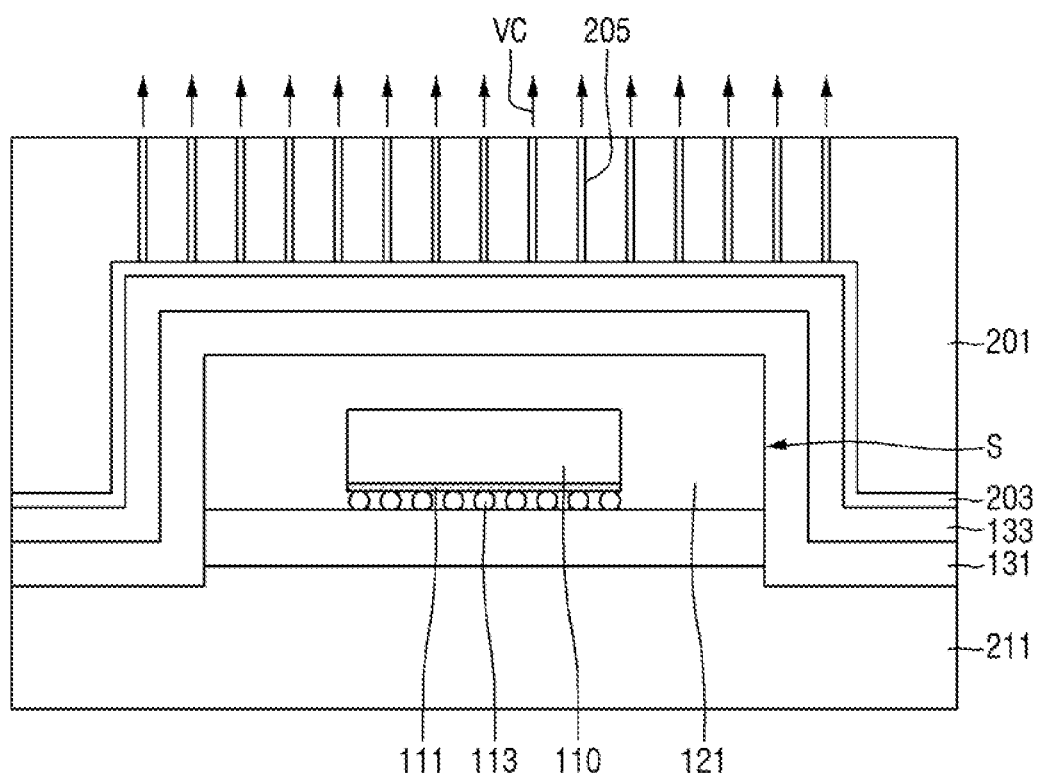

FIGS. 20 and 21 are intermediate stage diagrams illustrating the method for manufacturing the semiconductor package according to some exemplary embodiments of the present inventive concept.

Referring to FIG. 20, the semiconductor package substrate 101 having a semiconductor chip 110 mounted thereon may be provided on a second support table 211.

The auxiliary films 131 and 133 and the release film 203 may be provided under the first support 201. The first support table 201 may include a decompression section 205. For example, the vacuum (VC) may be applied to the first support table 201 through the decompression section 205. By the vacuum (VC), the auxiliary films 131 and 133 and the release film 203 may wrap around the inner wall of the first support table 201.

Referring to FIG. 21, the first support 201 and the second support 211 may be coupled together. The insulating layer 121 may mold the semiconductor chip 110, while covering the semiconductor package substrate 101, as the first support table 201 and the second support table 211 are coupled together.

For example, the internal space (S) may be formed by coupling the first support table 201 and the second support table 211. The insulating material contained in the insulating layer 121 may be provided to the internal space (S). For example, the insulating material may be provided into the internal space (S) by depressurizing the internal space (S) due to the vacuum (VC) provided on the first support table 201.

Referring to FIG. 2, the first support table 201 and the second support table 211 may be separated from the semiconductor package substrate 101. When the first support table 201 is separated, the release film 203 may be separated from the auxiliary films 131 and 133. Therefore, auxiliary films 131 and 133 may be formed on the insulating layer 121.

Hereinafter, the method for manufacturing the semiconductor package according to some exemplary embodiments of the present inventive concept will be described with reference to FIGS. 11a and 22 to 24. For the sake of clarity of explanation, repeated description will be simplified or omitted and it may be assumed that the omitted description is at least similar to that of corresponding elements that have already been described.

Figure 22:
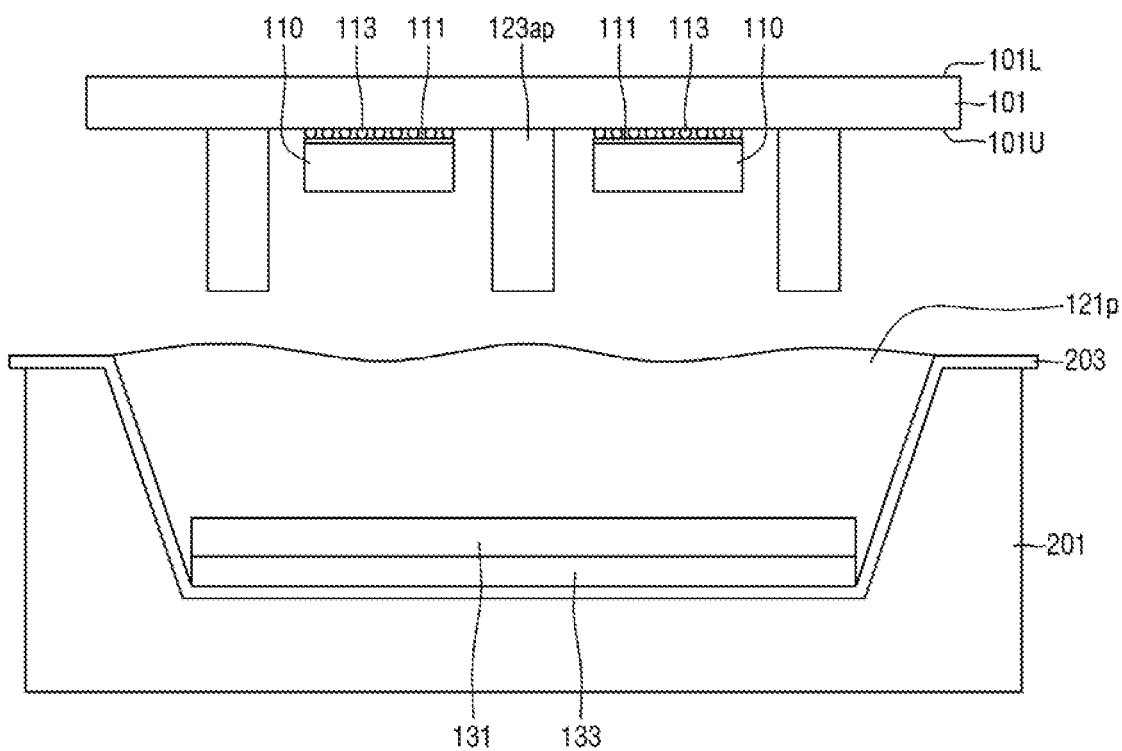
Figure 23:
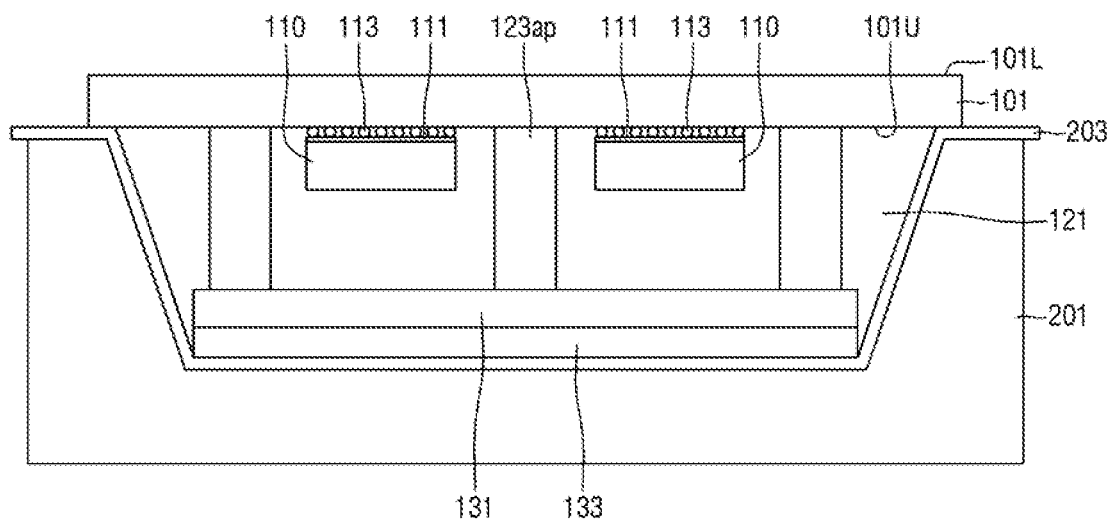
Figure 24:
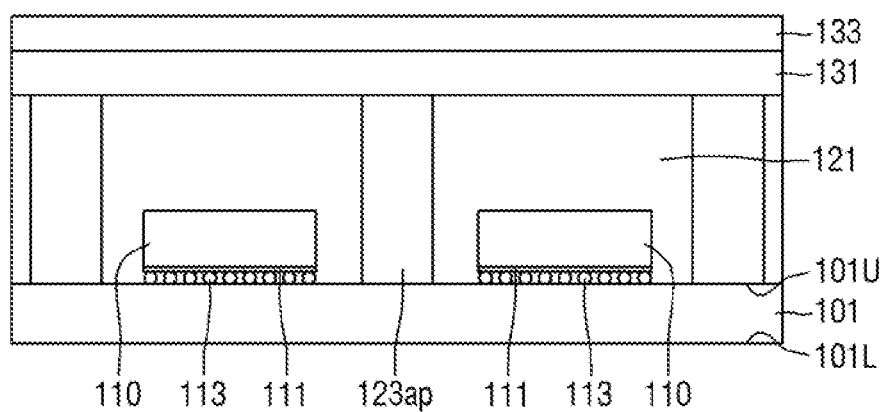

FIGS. 22 to 24 are intermediate stage diagrams illustrating the method for manufacturing the semiconductor package according to some exemplary embodiments of the present inventive concept.

Referring to FIG. 22, a free shielding layer 123ap may be formed between the plurality of semiconductor chips 110.

Referring to FIG. 23, the insulating layer 121 may be formed. The plurality of semiconductor chips 110 and the free shielding layer 123ap may be completely inserted into the insulating material (121p of FIG. 22) to form the insulating layer 121. The plurality of semiconductor chips 110 and the free shielding layer 123ap may be buried in the insulating layer 121.

Referring to FIG. 24, the first support 201 and the release film 203 may be removed. Thereafter, the shielding layer 123a of FIG. 11a may be formed through a singulation process or the like.

Hereinafter, the method for manufacturing the semiconductor package according to some exemplary embodiments of the present inventive concept will be described with reference to FIGS. 11b and 25 to 27. For the sake of clarity of explanation, repeated description will be simplified or omitted and it may be assumed that the omitted description is at least similar to that of corresponding elements that have already been described.

Figure 25:
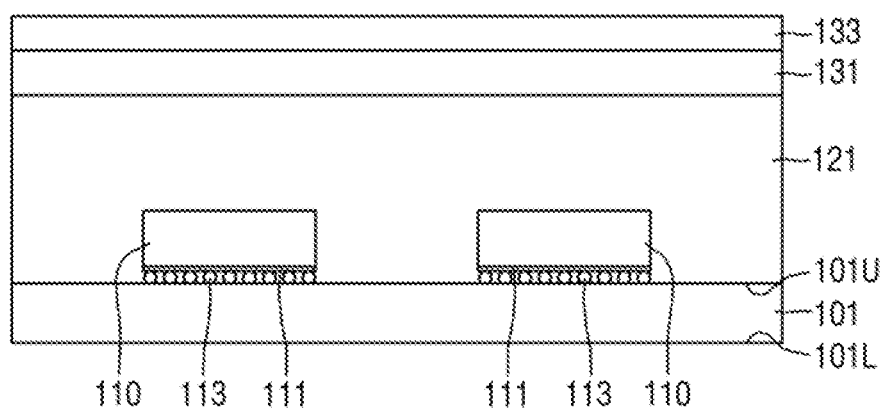
Figure 26:
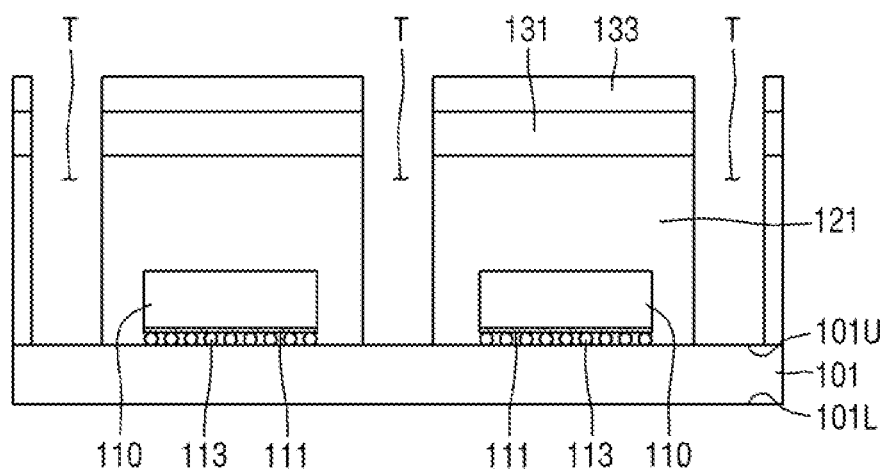
Figure 27:
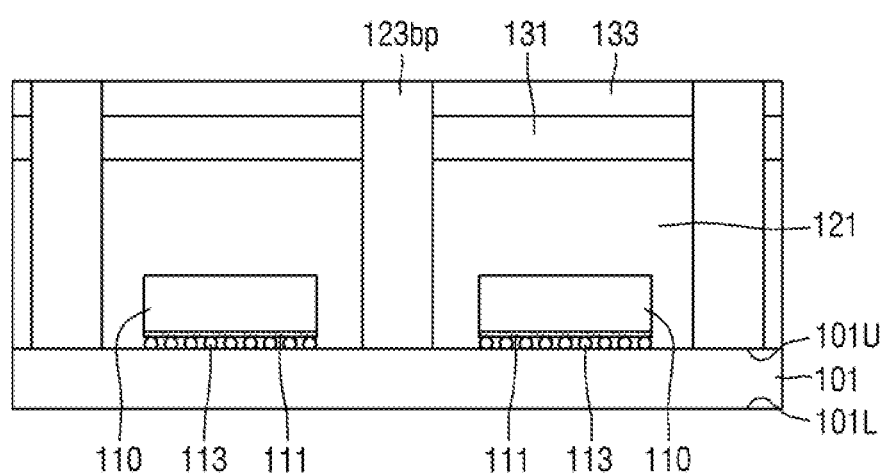

FIGS. 25 to 27 are intermediate stage diagrams illustrating the method for manufacturing the semiconductor package according to some exemplary embodiments of the present inventive concept. FIG. 25 may be a drawing after the first support table 201 and the release film 203 are separated and the singulation process and the like are performed in FIG. 18.

Referring to FIGS. 25 and 26, a trench (T) may be formed between the plurality of semiconductor chips 110. The trench (T) may be formed in the auxiliary films 131 and 133 and the insulating layer 121. The bottom surface of the trench (T) may be defined by the upper surface 101U of the semiconductor package substrate 101. The side wall of the trench (T) may be defined by the auxiliary films 131 and 133 and the insulating layer 121.

Referring to FIG. 27, a shielding material is filled in the trench (T), and a free shielding layer 123bp may be formed. Thereafter, the shielding layer 123b of FIG. 11b may be formed through a singulation process or the like.

While the present inventive concept has been particularly shown and described with reference to exemplary embodiments thereof, it will be understood by those of ordinary skill in the art that various changes in form and details may be made therein without departing from the spirit and scope of the present inventive concept. For example, elements and/or features of different exemplary embodiments may be combined with each other and/or substituted for each other within the scope of this disclosure and appended claims.

What is claimed is:

1. A semiconductor package, comprising:
a semiconductor package substrate;
an insulating layer disposed on the semiconductor package substrate;
a semiconductor chip disposed on the semiconductor package substrate and covered by the insulating layer;
a reflective layer disposed on the insulating layer and spaced apart from the semiconductor chip, the reflective layer configured to selectively transmit soft X-rays and hard X-rays through to the insulating layer to protect the semiconductor chip from the soft X-rays; and
a protective layer disposed on the reflective layer.

2. The semiconductor package of claim 1, wherein the reflective layer is configured to be more transmissive of hard X-rays than soft X-rays.

3. The semiconductor package of claim 1, wherein the reflective layer is configured to block soft X-rays, and transmit hard X-rays.

4. The semiconductor package of claim 1 wherein the reflective layer is configured to substantially block laser light.

5. The semiconductor package of claim 1, wherein the reflective layer includes a metal material having an atomic number greater than 12, and wherein the protective layer includes a same material as the insulating layer.

6. The semiconductor package of claim 1, wherein the reflective layer entirely covers an upper surface of the insulating layer.

7. The semiconductor package of claim 1, further comprising: a shielding layer spaced apart from the semiconductor chip and wrapping around the insulating layer between the semiconductor package substrate and the reflective layer, wherein the shielding layer extends from an upper surface of the semiconductor package substrate to a lower surface of the reflective layer.

8. The semiconductor package of claim 1, wherein the protective layer includes a thermochromic material and/or a photochromic material, and wherein the thermochromic material and/or the photochromic material has a crystal structure including crystal grains.

9. The semiconductor package of claim 1, further comprising: an insertion layer interposed between the reflective layer and the protective layer, wherein the insertion layer includes reflectors which are configured to reflect electromagnetic waves.

10. The semiconductor package of claim 1, further comprising: a heat transfer material layer disposed within the insulating layer between the semiconductor chip and the reflective layer.

11. A semiconductor package, comprising:
a semiconductor package substrate;
a molding layer disposed on the semiconductor package substrate; and
a semiconductor chip disposed on the semiconductor package substrate and covered by the molding layer,
wherein the semiconductor package is configured to be more transmissive of hard X-rays than soft X-rays to protect the semiconductor chip from the soft X-rays,
wherein the molding layer comprises:
an insulating layer disposed on an upper surface of the semiconductor package substrate and including the semiconductor chip therein;
a reflective layer disposed on the insulating layer and spaced apart from the semiconductor chip; and
a protective layer disposed on the reflective layer, and
wherein the reflective layer is configured to block soft X-rays, and transmit hard X-rays into the insulating layer.

12. The semiconductor package of claim 11, wherein the reflective layer is configured to block laser light.

13. A semiconductor package, comprising:
a semiconductor package substrate;
an insulating layer disposed on the semiconductor package substrate;
a semiconductor chip disposed on the semiconductor package substrate and covered by the insulating layer;
a reflective layer disposed on the insulating layer and spaced apart from the semiconductor chip and including a metal material having an atomic number greater than 12 to protect the semiconductor chip from soft X-rays; and
a protective layer disposed on the reflective layer.

14. The semiconductor package of claim 13, wherein the reflective layer is configured to be more transmissive of hard X-rays than soft X-rays.

15. The semiconductor package of claim 13, wherein the reflective layer is configured to block soft X-rays, and transmit hard X-rays.

16. The semiconductor package of claim 13, wherein the reflective layer is configured to block laser light.

* * * * *